US011990557B2

(12) United States Patent
Shen et al.

(10) Patent No.: US 11,990,557 B2
(45) Date of Patent: May 21, 2024

(54) MINIATURIZED OPTICAL SENSOR PACKAGE AND MANUFACTURING METHOD THEREOF

(71) Applicant: PixArt Imaging Inc., Hsin-Chu County (TW)

(72) Inventors: Chi-Chih Shen, Hsin-Chu County (TW); Kuo-Hsiung Li, Hsin-Chu County (TW); Shang-Feng Hsieh, Hsin-Chu County (TW); Jui-Cheng Chuang, Hsin-Chu County (TW); Yi-Chang Chang, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 141 days.

(21) Appl. No.: 17/083,763

(22) Filed: Oct. 29, 2020

(65) Prior Publication Data

US 2022/0140173 A1   May 5, 2022

(51) Int. Cl.
| | |
|---|---|
| *H01L 31/14* | (2006.01) |
| *H01L 27/146* | (2006.01) |
| *H01L 31/0203* | (2014.01) |
| *H01L 31/0232* | (2014.01) |
| *H01L 31/18* | (2006.01) |

(52) U.S. Cl.
CPC ...... *H01L 31/143* (2013.01); *H01L 27/14625* (2013.01); *H01L 31/0203* (2013.01); *H01L 31/02325* (2013.01); *H01L 31/186* (2013.01)

(58) Field of Classification Search
CPC .......................... H01L 25/042; H01L 25/0753
See application file for complete search history.

(56) References Cited

U.S. PATENT DOCUMENTS

| | | | | |
|---|---|---|---|---|
| 2016/0284920 A1* | 9/2016 | Saugier | ............... | H01L 31/0203 |
| 2021/0373132 A1* | 12/2021 | Etschmaier | ........... | G01S 7/4813 |
| 2022/0102576 A1* | 3/2022 | Huang | .............. | H01L 31/02164 |

* cited by examiner

*Primary Examiner* — Matthew L Reames
(74) *Attorney, Agent, or Firm* — HAUPTMAN HAM, LLP

(57) ABSTRACT

There is provided an optical sensor package including a substrate, a base layer, an optical detection region, a light source and a light blocking wall. The base layer is arranged on the substrate. The light detection region and the light source are arranged on the base layer. The light blocking wall is arranged on the base layer, and located between the light detection region and the light source to block light directly propagating from the light source to the light detection region.

8 Claims, 5 Drawing Sheets

MINIATURIZED OPTICAL SENSOR PACKAGE AND MANUFACTURING METHOD THEREOF

BACKGROUND

1. Field of the Disclosure

This disclosure generally relates to an optical sensor package and, more particularly, to a miniaturized optical sensor package that has a light blocking wall between the light source and the light detection region and directly attached on a base layer of an optical sensor chip and a manufacturing method thereof.

2. Description of the Related Art

The conventional optical sensor package generally includes an optical sensor chip and a light source arranged on a printed circuit board, respectively. A light blocking cover manufactured independently is arranged on the printed circuit board to separate the light source and the optical sensor chip. The size of this kind of optical sensor package is large and thus not suitable to be adapted to a movable electronic device or wearable electronic device.

Accordingly, the present disclosure further provides a miniaturized optical sensor package that arranges a light blocking wall between the light source and the light detection region directly on a base layer of an optical sensor chip and a manufacturing method thereof.

SUMMARY

The present disclosure provides an optical sensor package in which the light source and the light blocking wall are directly formed on a base layer of an optical sensor chip to effectively reduce a size thereof.

The present disclosure provides an optical sensor package including an optical sensor chip, a first light blocking wall and a second light blocking wall. The optical sensor chip includes a base layer, a light detection region and a light source. The light detection region is arranged in the base layer. The light source is arranged on and electrically coupled to the base layer. The first light blocking wall is arranged on the base layer of the optical sensor chip, and located between the light detection region and the light source. The second light blocking wall is stacked on the first light blocking wall and has a different material from the first light blocking wall.

The present disclosure further provides a manufacturing method of an optical sensor package including the steps of: arranging an optical sensor chip, which has a light detection region and a light source, on an upper surface of a substrate; arranging a first light blocking wall on a base layer of the optical sensor chip between the light detection region and the light source; forming a transparent layer to encapsulate the upper surface of the substrate, the optical sensor chip and the first light blocking wall; cutting the transparent layer upon the first light blocking wall to form a groove reaching the first light blocking wall; and injecting opaque plastic in the groove to form a second light blocking wall.

The present disclosure further provides an optical sensor package including a substrate, an optical sensor chip and an opaque cover. The optical sensor chip includes a base layer, a light detection region and a light source. The base layer is arranged on and electrically coupled to the substrate. The light detection region is arranged in the base layer. The light source is arranged on and electrically coupled to the base layer. The opaque cover has a first space for accommodating the light source and a second space for accommodating the light detection region. The opaque cover further has a light blocking wall arranged on the base layer and between the light detection region and the light source.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The optical sensor package of the present disclosure effectively reduces a package size by arranging a light source and a light blocking wall directly on a base layer of an optical sensor chip. In the present disclosure, the optical sensor chip is a previously manufactured chip, and a light blocking structure or a light blocking cover is formed on or combined with the optical sensor chip after the optical sensor chip is arranged on a substrate so as to eliminate the interference from stray light.

Figure 1:
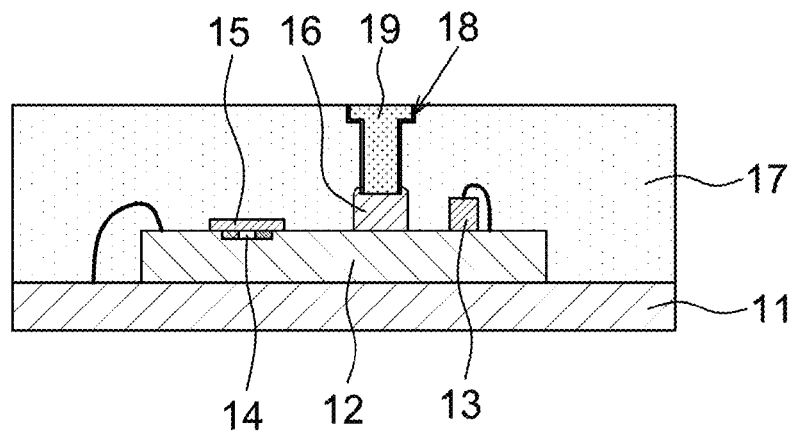
FIG. 1 is a cross sectional view of an optical sensor package according to a first embodiment of the present disclosure.

Please referring to FIG. 1, it is a cross sectional view of an optical sensor package 100 according to a first embodiment of the present disclosure. The optical sensor package 100 includes a substrate 11, an optical sensor chip, a first light blocking wall 16, a transparent layer 17 and a second light blocking wall 19, wherein the optical sensor chip includes a base layer 12, an optical detection region 14 and a light source 13. In some aspects, the optical sensor chip further includes a light filter 15 covering or coating upon the light detection region 14 for blocking light outside the spectrum of the light source 13.

The substrate 11 is, for example, a printed circuit board (PCB) or a flexible circuit board (FCB). The substrate 11 transmits signals, e.g., including detected signals and control signals, between the optical sensor chip and an external device or element.

The optical sensor chip is a semiconductor sensor chip, e.g., a CMOS image sensor chip, but not limited to. A base layer 12 of the optical sensor chip is arranged on the substrate 11 and electrically coupled to the substrate 11. The base layer 12 is made of semiconductor materials used in, for example, the base layer of CMOS image sensors, and a light detection region 14 is formed therein. The light detection region 14 includes at least one light sensing pixel for detecting incident light from above of the optical sensor chip. For example, the light detection region 14 includes a pixel array for sensing visible light or infrared light. The method of forming light sensing pixels in the base layer 12 is known to the art and not a main objective of the present disclosure, and thus details thereof are not described herein. The present disclosure is to reduce a size of encapsulating the optical sensor chip.

The light source 13 is arranged on the base layer 12 and electrically coupled to the base layer 12 so as to receive control signals and electricity from the substrate 11 via the base layer 12 to illuminate light. The light source 13 is a light emitting diode or a laser diode for emitting light of an identifiable spectrum.

In the present disclosure, the first light blocking wall 16 is arranged on the base layer 11, and located between the light detection region 14 and the light source 13. The first light blocking wall 16 has a height H (e.g., referring to FIG. 2B) preferably larger than 2 micrometers, e.g., between 2 micrometers and 500 micrometers. The first light blocking wall 16 is made of any proper plastic material or rubber material without particular limitations as long as it is not transparent to the spectrum of the light source 13. If the first light blocking wall 16 is in a solid state before being arranged on the base layer 12, the first light blocking wall 16 is adhered to the base layer 12 using adhesive, preferably opaque adhesive. If the first light blocking wall 16 is in a fluid state or a semi-fluid state before being arranged on the base layer 12, the first light blocking wall 16 is arranged on the based layer 12 using dispensing process. Preferably, the first light blocking wall 16 is cured before being encapsulated by the transparent layer 17.

The transparent layer 17 encapsulates an upper surface of the substrate 11, the base layer 12, the light detection region 12 (also encapsulating the light filter if included), the first light blocking wall 16 and the light source 13 to protect the components therein. The transparent layer 17 is made of transparent plastic, transparent rubber or glass without particular limitations as long as it is transparent to the spectrum of the light source 13, and is formed by, e.g., molding process, and cut with a groove 18 therein for containing the second light blocking wall 19. As shown in FIG. 1, the second light blocking wall 19 is stacked on the first light blocking wall 16 and has a different material from the first light blocking wall 16. For example, the second light blocking wall 19 is in a fluid state or a semi-fluid state before being injected in the groove 18 and having a lower viscosity than that of the first light blocking wall 16, and the fluid state or the semi-fluid state is then cured after being injected into the groove 18.

Please referring to FIGS. 2A to 2D, a manufacturing method of an optical sensor package 100 according to a first embodiment of the present is described hereinafter.

Figure 2A:
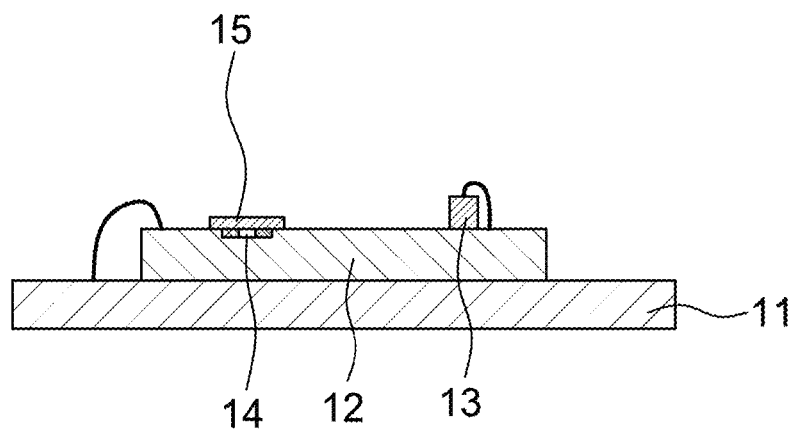
FIGS. 2A to 2D are cross sectional views of different steps of a manufacturing method of an optical sensor package according to a first embodiment of the present disclosure.

Firstly, an optical sensor chip already formed with a light detection region 14 and a light source 13 is arranged on the substrate 11. Said arranging includes attaching the optical sensor chip on the substrate 11 and electrically coupling the optical sensor chip to the substrate 11, as shown in FIG. 2A. Although FIG. 2A shows that the optical sensor chip is electrically coupled to the substrate 11 using a wire bonding, the present disclosure is not limited thereto. In other aspects, the optical sensor chip is electrically coupled to the substrate 11 by other method.

Figure 2B:
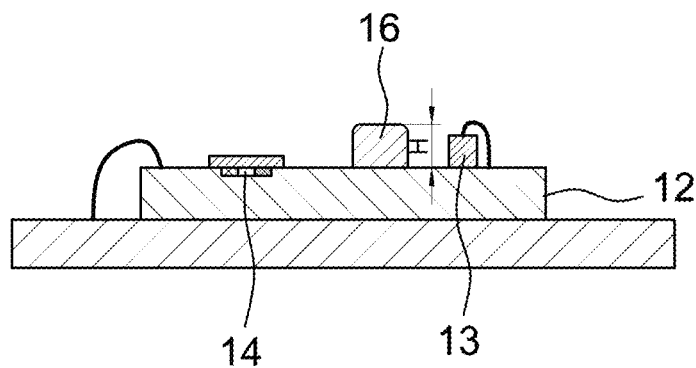

Next, a first light blocking wall 16 is arranged on an upper surface of a base layer 12 of the optical sensor chip, and located between the light detection region 14 and the light source 13, as shown in FIG. 2B.

Figure 2C:
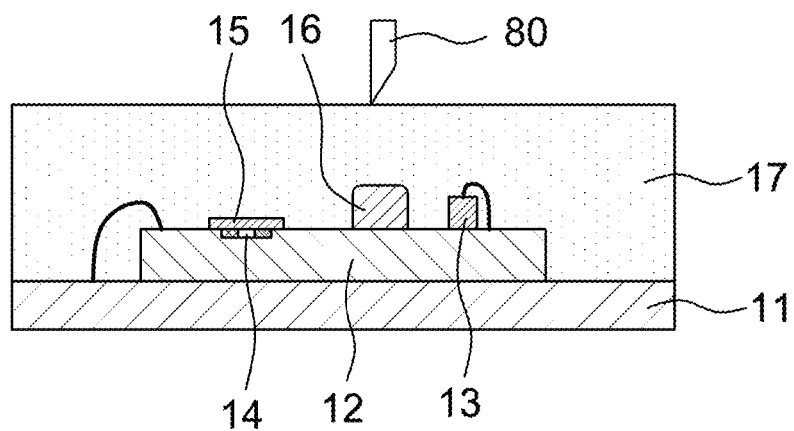

Then, a transparent layer 17 is covered or encapsulated on the upper surface of the substrate 11, the optical sensor chip and the first light blocking wall 16 to protect the substrate 11 and electronic components on the substrate 11, as shown in FIG. 2C.

Figure 2D:
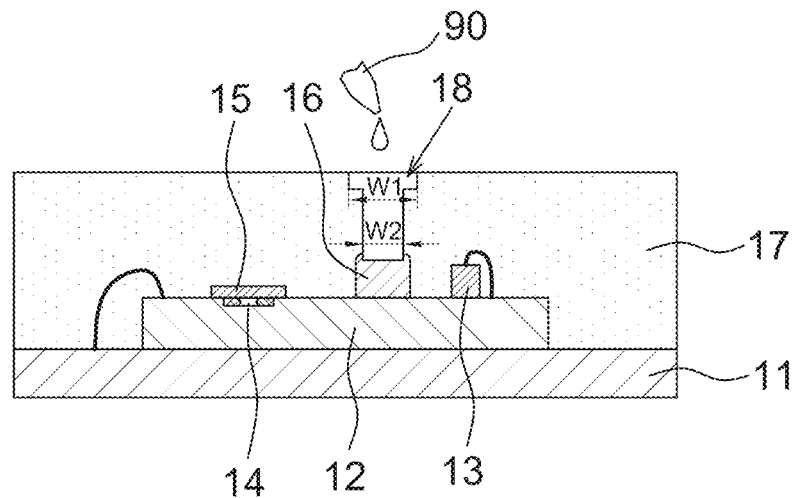

Then, a cutting blade 80 is used to cut the transparent layer 17 from a surface thereof above the first light blocking wall 16 to the first light blocking wall 16 so as to form a groove 18 reaching the light blocking wall 16, as shown in FIG. 2D. In this embodiment, a width of the groove 18 is preferably larger than 10 micrometers to cause the opaque material injected later to effectively block light from the light source 13. In one aspect, in cutting the transparent layer 17, a notch is cut on an upper surface of the first light blocking wall 16 to accommodate a bottom part of the second light blocking wall 19 injected in the groove 18 later. As mentioned above, the first light blocking wall 16 preferably has a height H larger than 2 micrometers to avoid damaging the base later 12 in the cutting process.

In one aspect, in cutting the transparent layer 17, a first width W1 is formed at an upper part of the groove 18 and a second width W2, which is smaller than the first width W1, is formed at a lower part of the groove 18 to facilitate the injection of opaque material in the flowing step. For example, a thin blade is used at first to cut a groove 18 that reaches the first light blocking wall 16 and has the second width W2 to avoid damaging the base layer 12 and other components thereon. Next, a thicker blade is used to cut the upper part of the groove 18 to form the first width W1. The first width W1 is preferably larger than the second width W2 by at least 10 micrometers, e.g., between 10 micrometers and 1000 micrometers, but the present disclosure is not limited thereto. In another aspect, the groove 18 has an identical width from up to bottom.

Finally, fluid opaque material is filled or injected in the groove 18 using an injection device 90 to form the second light blocking wall 19 after being cured, as shown in FIG. 1. Corresponding to a shape of the groove 18, FIG. 1 shows that the second light blocking wall 19 has the first width W1 at an upper part thereof and the second width W2, which is smaller than the first width W1, at a lower part thereof. When the groove 18 has a consistent width, the second light blocking wall 19 also has a consistent width in the transverse direction.

It should be mentioned that although FIG. 1 shows that there is a space between the groove 18 and the second light blocking wall 19, it is only intended to show that the second light blocking wall 19 is accommodate in the groove 18. Since the second light blocking wall 19 is injected in the groove 18 in a fluid state or semi-fluid state, the second light blocking wall 19 is well combined and attached to the inner surface of the groove 18.

Accordingly, a light blocking wall (including the first light blocking wall 16 and the second light blocking wall 19) is formed between the light detection region 14 and the light source 13 to prevent the light emitted by the light source 13 from directly propagating to the light detection region 14 before ejecting from the optical sensor package 100.

Figure 3:
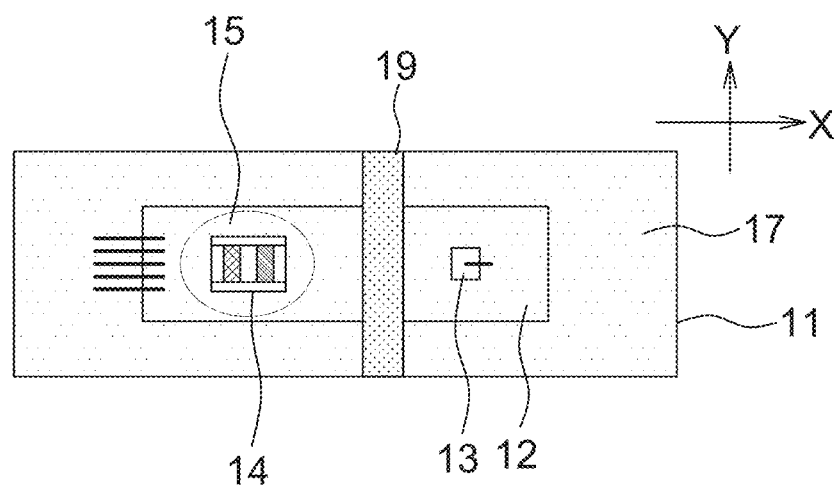
FIG. 3 is an upper view of an optical sensor package according to a first embodiment of the present disclosure.

Please referring to FIG. 3, it is an upper view of an optical sensor chip 100 according to a first embodiment of the present disclosure. In FIG. 3, the light detection region 14 and the light source 13 are arranged on the base layer 12 along a first direction (e.g., X-direction in FIG. 3), and the first light blocking wall 16, the second light blocking wall 19 and the groove 18 extend to an upper surface of the substrate 11 along a direction (e.g., Y-direction in FIG. 3) perpendicular to a direction of connection line (i.e., the X-direction) between the light detection region 14 and the light source 13. As the light source 13 and the light blocking wall are both disposed on the base layer 12, it is able to reduce a size of the optical sensor package 100.

Figure 4:
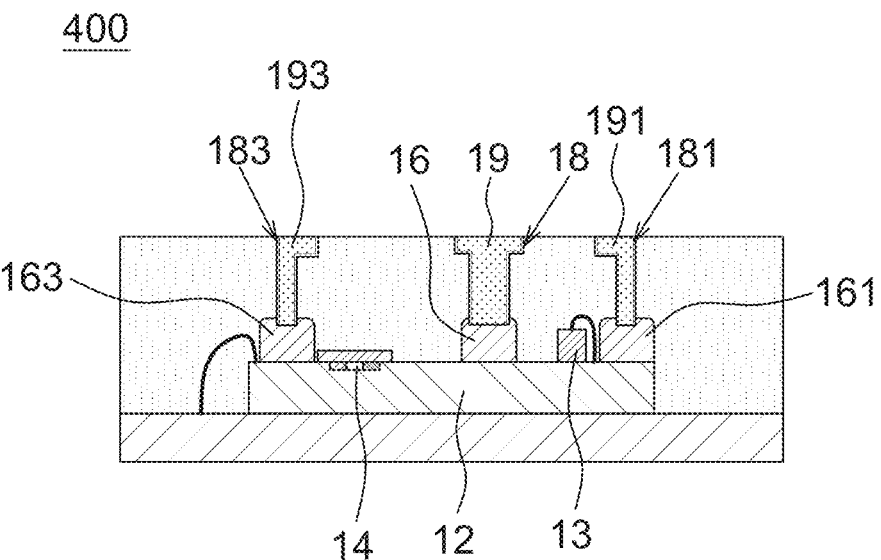
FIG. 4 is another cross sectional view of an optical sensor package according to a first embodiment of the present disclosure.

Please referring to FIG. 4, it is another cross sectional view of an optical sensor package 400 according to a first embodiment of the present disclosure. The different between FIG. 4 and FIG. 1 is that the optical sensor chip 400 further includes fringe light blocking walls arranged on the base layer 12 outside the light detection region 14 and the light source 13. In this aspect, the fringe light blocking walls include upper parts 191 and 193 corresponding to the second light blocking wall 19, and lower parts 161 and 163 corresponding to the first light blocking wall 16.

For example, in the step shown in FIG. 2B, in addition to the first light blocking wall 16, the lower parts 161 and 163 are further arranged on the base layer 12 as shown in FIG. 4. The method of forming the lower parts 161 and 163 is identical to that of forming the first light blocking wall 16 only at different positions. In one aspect, the lower parts 161 and 163 also extend on upper surfaces of the base layer 12 and the substrate 11 along the second direction Y, e.g., parallel to the first light blocking wall 16.

Next, in the step shown in FIG. 2C, corresponding grooves 181 and 183 are cut in the transparent layer 17 respectively upon the lower parts 161 and 163 by the blade 80 as shown in FIG. 4. For example, said corresponding grooves 181 and 183 have a shape which has a larger width at the upper part thereof and a smaller width at the lower part thereof, or have a consistent width from up to bottom.

Finally, in the step shown in FIG. 2D, the grooves 181 and 183 corresponding to the lower parts 161 and 163 are injected or filled with opaque material, same with the second light blocking wall 19, to form the upper parts 191 and 193 as shown in FIG. 4, respectively after being cured.

Figure 5:
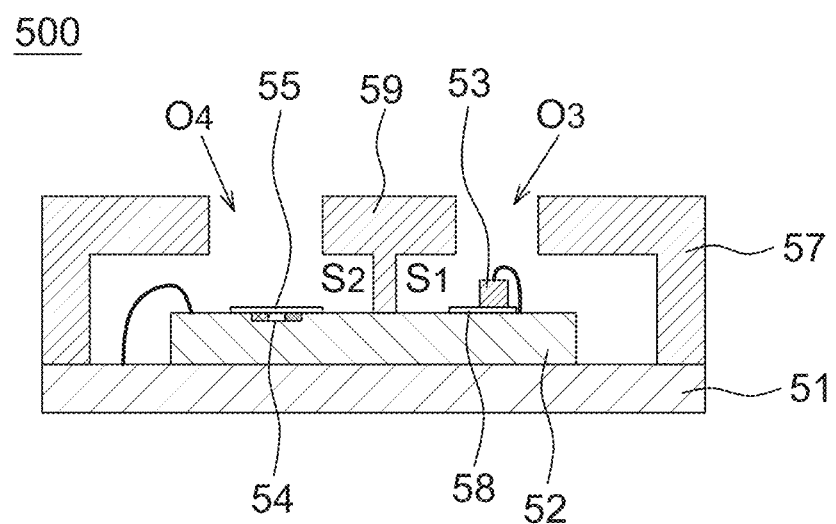
FIG. 5 is a cross sectional view of an optical sensor package according to a second embodiment of the present disclosure.

Please referring to FIG. 5, it is a cross sectional view of an optical sensor package 500 according to a second embodiment of the present disclosure. The optical sensor package 500 includes a substrate 51, an optical sensor chip and an opaque cover (including 57 and 59). The optical sensor chip includes a base layer 52, a light detection region 54 and a light source 53. In some aspects, the optical sensor chip further includes a light filter 55 covering upon the light detection region 54. It should be mentioned that although FIG. 5 shows that the light filter 55 is directly covered on the light detection region 54, the present disclosure is not limited thereto. In other aspects, the light filter 55 is fixed at or in an opening O4 of the opaque cover.

In the second embodiment, the substrate 51 and the optical sensor chip are respectively identical to the substrate 11 and the optical sensor chip of the first embodiment, and thus details thereof are not repeated herein. The difference between the second embodiment and the first embodiment is at the arrangement of the light blocking element. In one aspect, the light source 53 has a vertical circuit, e.g., vertical cavity surface emitting laser (VCSEL), and the optical sensor chip 500 further has a metal conductor 58 arranged between the light source 53 and the base layer 52 as a conducting layer.

The opaque cover is previously made of, for example, opaque plastic or rubber, and has a first space S1 for accommodating the light source 53 and a second space S2 for accommodating the light detection region 54. The opaque cover includes a light blocking wall 59 for arranging on the base layer 52 and located between the light detection region 54 and the light source 53. A width (e.g., along the X-direction shown in FIG. 6) of the light blocking wall 59 is preferably larger than 10 micrometers to effectively prevent emission light of the light source 53 from directly penetrating the light blocking wall 59. The light blocking wall 59 is, for example, adhered on a surface of the base layer 52 using an opaque adhesive. For example, before arranging the opaque cover on the base layer 52, the opaque adhesive is dispensed at a predetermined position corresponding to the light blocking wall 59 to have a height larger than 2 micrometers, e.g., between 2 micrometers and 500 micrometers. The opaque cover is arranged on the base layer 52 by aligning the light blocking wall 59 to the predetermined position of the opaque adhesive.

The opaque cover is a cover manufactured separately from the optical sensor chip. One benefit of using the opaque adhesive under the light blocking wall 59 is to reduce the precision requirement of manufacturing the light blocking wall 59. That is, even though the light blocking wall 59 is not manufactured to exactly attach to the base layer 52 after being put thereon, the light leakage is still blocked by the opaque adhesive.

As shown in FIG. 5, the opaque cover further include a fringe sidewall 57 arranged on the substrate 51. The fringe sidewall 57 is preferably surrounding outside the first space S1 and the second space S2, and the light blocking wall 59 divides the first space S1 and the second space S2. The opaque cover has an opening O3 for the emission light from the light source 53 to eject from the optical sensor chip 500 therethrough, and has an opening O4 for the external light to enter the second space S2 therethrough. The second embodiment is also to reduce the package size by directly arranging the light blocking wall 59 and the light source 53 on the base layer 52.

Figure 6:
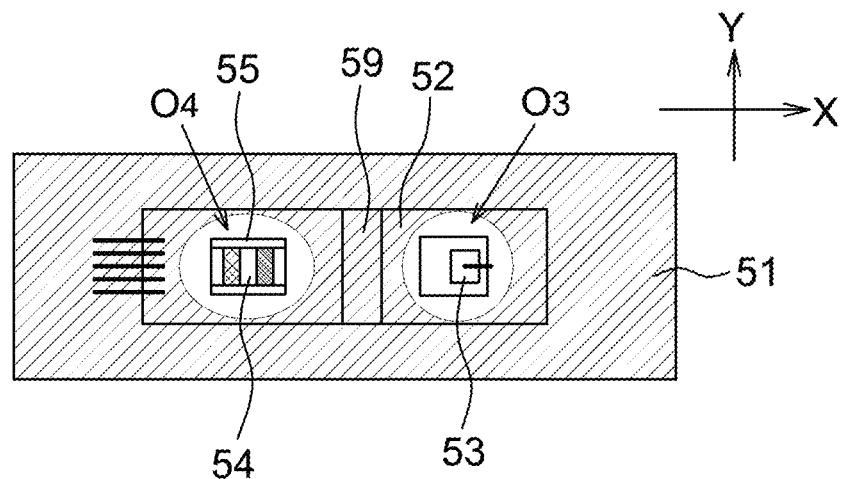
FIG. 6 is an upper view of an optical sensor package according to a second embodiment of the present disclosure.

Please referring to FIG. 6, it is an upper view of an optical sensor chip 500 according to a second embodiment of the present disclosure. In FIG. 6, the light detection region 54 and the light source 53 are arranged on the base layer 53 along a first direction (e.g., X-direction), and the light blocking wall 59 extends on the base layer 52 along a direction (e.g., Y-direction) perpendicular to a direction of connection line (i.e. X-direction) between the light detection region 54 and the light source 53. In the second embodiment, the light blocking wall 59 does not extend to an upper surface of the substrate 51. It is seen form FIG. 6 that the substrate 51 and the optical sensor chip are covered by the opaque cover (i.e. area filled with slant lines) only with exposed regions within the openings O3 and O4.

Figure 7:
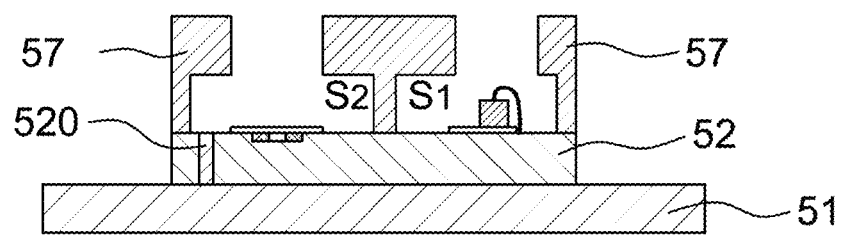
FIG. 7 is another cross sectional view of an optical sensor package according to a second embodiment of the present disclosure.

To further reduce the package size, in another aspect the fringe sidewall 57 of the opaque cover is arranged on the base layer 52, as shown in FIG. 7. FIG. 7 is another cross sectional view of an optical sensor package 700 according to a second embodiment of the present disclosure. Similarly, the fringe sidewall 57 is adhered to a surface of the base layer 52 using opaque adhesive. In this aspect, the optical sensor chip is a flip chip which has bumps under the chip. In this case, the base layer 53 further has a through silicon via (TSV) 520 as a conducting path, wherein details of forming the through silicon via 520 and flip chip is known to the art is known to the art, and thus are not described therein.

In an alternative aspect, a first space 51 and a second space S2 of the optical sensor chip 700 of FIG. 7 are filled with transparent material to protect components therein.

As mentioned above, in the conventional optical sensor package, a light blocking cover is disposed on the substrate to separate spaces between the optical sensor chip and the light source such that it has a larger package size.

Accordingly, the present disclosure further provides an optical sensor package (e.g., FIGS. 1, 4 and FIGS. 5, 7) and a manufacturing method of an optical sensor package (FIGS. 2A-2D) that arrange a light blocking wall on the optical sensor die instead of on the substrate to realize a miniaturized package structure.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An optical sensor package, comprising:
   an optical sensor chip, the optical sensor chip comprising:
   a base layer;
   a light detection region, arranged in the base layer; and
   a light source, arranged on and electrically coupled to the base layer;
   a first light blocking wall, arranged on the base layer of the optical sensor chip, and located between the light detection region and the light source, the first light blocking wall extending in a first direction and having an upper surface extending in the first direction, wherein the upper surface has an inner portion extending in the first direction and an outer portion surrounding the entire inner portion in a second direction perpendicular to the first direction;
   a transparent layer, disposed on the optical sensor chip and the first light blocking wall, wherein the transparent layer has a groove exposing the first light blocking wall, and an upper part of the groove has a first width, and a lower part of the groove has a second width smaller than the first width; and
   a second light blocking wall, filled in the groove and stacked on the first light blocking wall, wherein a bottom part of the second light blocking wall is stacked only on the inner portion of the upper surface of the first light blocking wall.

2. The optical sensor package as claimed in claim 1, further comprising a substrate, wherein the base layer of the optical sensor chip is arranged on and electrically coupled to the substrate.

3. The optical sensor package as claimed in claim 2, wherein the transparent layer encapsulating an upper surface of the substrate, the base layer, the light detection region, the first light blocking wall and the light source.

4. The optical sensor package as claimed in claim 1, further comprising a light filter covering on the light detection region.

5. The optical sensor package as claimed in claim 1, further comprising a fringe light blocking wall arranged on the base layer outside the light detection region and the light source, wherein the fringe light blocking wall comprises an upper part corresponding to the second light blocking wall and a lower part corresponding to the first light blocking wall.

6. The optical sensor package as claimed in claim 1, wherein the upper surface of the first light blocking wall has a notch for accommodating the bottom part of the second light blocking wall.

7. The optical sensor package as claimed in claim 6, wherein
   the notch is located at the inner portion of the upper surface of the first light blocking wall, and
   the outer portion is higher than the inner portion.

8. The optical sensor package as claimed in claim 6, wherein
   the notch is located at the inner portion of the upper surface of the first light blocking wall, and
   a width of the notch in the second direction is smaller than a width of the first light blocking wall in the second direction.

* * * * *